United States Patent
Kushnick et al.

(10) Patent No.: US 9,310,427 B2
(45) Date of Patent: Apr. 12, 2016

(54) HIGH SPEED TESTER COMMUNICATION INTERFACE BETWEEN TEST SLICE AND TRAYS

(71) Applicant: Advantest Corporation, Tokyo (JP)

(72) Inventors: Eric Kushnick, San Jose, CA (US); Mei-Mei Su, Mountain View, CA (US); Roland Wolff, Santa Rosa, CA (US)

(73) Assignee: ADVANTEST CORPORATION, Tokyo (JP)

( * ) Notice: Subject to any disclaimer, the term of this patent is extended or adjusted under 35 U.S.C. 154(b) by 116 days.

(21) Appl. No.: 13/950,164

(22) Filed: Jul. 24, 2013

(65) Prior Publication Data
US 2015/0028908 A1  Jan. 29, 2015

(51) Int. Cl.
*G01R 31/28* (2006.01)
*G06F 11/22* (2006.01)
*G11C 29/56* (2006.01)

(52) U.S. Cl.
CPC ........ *G01R 31/2863* (2013.01); *G06F 11/2221* (2013.01); *G11C 29/56012* (2013.01); *G01R 31/2889* (2013.01); *G11C 2029/5602* (2013.01)

(58) Field of Classification Search
CPC . G06F 11/263; G06F 11/261; G01R 31/2834; G01R 31/31907; G01R 31/31908; G01R 31/31917; G01R 31/31926; G01R 31/01; G01R 31/31905; G01R 31/2893; G01R 31/2867; G01R 31/2851; G01R 31/2868; G01R 31/2889; G01R 31/2806; G11C 29/56
USPC ............. 324/750.05, 757.01, 750.3, 756.02, 324/762.01, 754.21, 762.03, 762.05
See application file for complete search history.

(56) References Cited

U.S. PATENT DOCUMENTS

| | | | |
|---|---|---|---|
| 6,069,873 A | 5/2000 | Pugaczewski et al. | |
| 6,357,023 B1* | 3/2002 | Co | G01R 31/01 714/42 |
| 6,681,351 B1 | 1/2004 | Kittross et al. | |
| 6,904,375 B1 | 6/2005 | Sabih et al. | |
| 7,181,360 B1 | 2/2007 | Nikolac et al. | |
| 7,269,805 B1 | 9/2007 | Ansari et al. | |
| 7,343,558 B2 | 3/2008 | Kadota | |
| 7,363,188 B1 | 4/2008 | Olgaard et al. | |
| 7,555,589 B2 | 6/2009 | Kang | |
| 8,127,187 B2* | 2/2012 | Xia et al. | 714/726 |
| 8,161,402 B1 | 4/2012 | Edson et al. | |
| 8,545,248 B2* | 10/2013 | Davey et al. | 439/271 |
| 8,564,297 B2* | 10/2013 | Burns et al. | 324/403 |
| 8,581,614 B2* | 11/2013 | Co | G11C 29/56 324/757.01 |
| 8,660,424 B2* | 2/2014 | Achkir et al. | 398/22 |
| 2002/0184326 A1 | 12/2002 | Thomson | |
| 2003/0191590 A1 | 10/2003 | Narayan et al. | |
| 2003/0231741 A1 | 12/2003 | Rancu et al. | |
| 2004/0168111 A1 | 8/2004 | Arnold et al. | |
| 2004/0225465 A1 | 11/2004 | Pramanick et al. | |

(Continued)

*Primary Examiner* — Alesa Allgood

(57) ABSTRACT

A tester system is disclosed. The tester system comprises a tester module operable to generate test signals for testing a plurality of DUTs. It also comprises a plurality of cables operable to communicatively couple the tester module with a tray comprising the plurality of DUTs through a thermal chamber wall interface. Further, it comprises a plurality of connectors in contact with the tray, wherein the plurality of connectors is operable to provide an interface between the plurality of cables and conductive traces on the tray, and further wherein each of the plurality of connectors is operable to pass a respective subset of the test signals to each DUT on the tray via the conductive traces.

20 Claims, 12 Drawing Sheets

(56) References Cited

U.S. PATENT DOCUMENTS

| | | |
|---|---|---|
| 2005/0154550 A1 | 7/2005 | Singh et al. |
| 2005/0159050 A1* | 7/2005 | Hama ................ G01R 1/07378 |
| | | 439/651 |
| 2005/0256969 A1 | 11/2005 | Yancey et al. |
| 2005/0262414 A1 | 11/2005 | Elston et al. |
| 2005/0273685 A1 | 12/2005 | Sachdev et al. |
| 2007/0220380 A1 | 9/2007 | Ohanyan |
| 2007/0266288 A1 | 11/2007 | Volkerink et al. |
| 2007/0282556 A1 | 12/2007 | Achkar et al. |
| 2008/0015798 A1 | 1/2008 | Bullock et al. |
| 2008/0189060 A1 | 8/2008 | Zellner et al. |
| 2008/0204066 A1 | 8/2008 | Jang et al. |
| 2009/0112548 A1 | 4/2009 | Conner |
| 2010/0157854 A1 | 6/2010 | Anderson et al. |
| 2010/0312517 A1 | 12/2010 | McNamara et al. |
| 2010/0313071 A1 | 12/2010 | Conner |
| 2011/0050268 A1* | 3/2011 | Co ........................ G11C 29/56 |
| | | 324/757.01 |
| 2011/0078525 A1 | 3/2011 | Xia et al. |
| 2011/0099424 A1 | 4/2011 | Rivera Trevino et al. |
| 2011/0112790 A1 | 5/2011 | Lavie et al. |
| 2011/0248737 A1* | 10/2011 | Takeshita ........... G01R 31/2889 |
| | | 324/756.02 |
| 2011/0276302 A1 | 11/2011 | Rivoir |
| 2011/0298486 A1* | 12/2011 | Co ................... G11C 29/56016 |
| | | 324/756.02 |
| 2012/0191402 A1* | 7/2012 | Filler et al. ..................... 702/119 |
| 2013/0013969 A1 | 1/2013 | Rajarao et al. |
| 2013/0015873 A1* | 1/2013 | Suzuki ................ H01R 12/721 |
| | | 324/755.02 |

\* cited by examiner

HIGH SPEED TESTER COMMUNICATION INTERFACE BETWEEN TEST SLICE AND TRAYS

CROSS-REFERENCE TO RELATED APPLICATIONS

Related Applications

The present application is related to U.S. patent application Ser. No. 13/773,580, filed Feb. 21, 2013, entitled "A TESTER WITH MIXED PROTOCOL ENGINE IN A FPGA BLOCK," naming John Frediani and Andrew Niemic as inventors. That application is incorporated herein by reference in its entirety and for all purposes.

The present application is related to U.S. patent application Ser. No. 13/773,555, filed Feb. 21, 2013, entitled "A TESTER WITH ACCELERATION ON MEMORY AND ACCELERATION FOR AUTOMATIC PATTERN GENERATION WITHIN A FPGA BLOCK," naming John Frediani as inventor. That application is incorporated herein by reference in its entirety and for all purposes.

The present application is related to U.S. patent application Ser. No. 13/733,569 filed Feb. 21, 2013, entitled "A TEST ARCHITECTURE HAVING MULTIPLE FPGA BASED HARDWARE ACCELERATOR BLOCKS FOR TESTING MULTIPLE DUTS INDEPENDENTLY," naming Gerald Chan, Andrew Niemic, Eric Kushnick, and Mei-Mei Sui as inventors. That application is incorporated herein by reference in its entirety and for all purposes.

The present application is related to U.S. patent application Ser. No. 13/773,597, filed Feb. 21, 2013, entitled "GUI IMPLEMENTATIONS ON CENTRAL CONTROLLER COMPUTER SYSTEM FOR SUPPORTING PROTOCOL INDEPENDENT DEVICE TESTING," naming Gerald Chan as inventor. That application is incorporated herein by reference in its entirety and for all purposes.

The present application is related to U.S. patent application Ser. No. 13/781,337, filed Feb. 28, 2013, entitled "A TESTER WITH ACCELERATION FOR PACKET BUILDING WITHIN A FPGA BLOCK," naming John Frediani as inventor. That application is incorporated herein by reference in its entirety and for all purposes.

The present application is related to U.S. patent application Ser. No. 13/773,628, filed Feb. 21, 2013, entitled "CLOUD BASED INFRASTRUCTURE FOR SUPPORTING PROTOCOL RECONFIGURATIONS IN PROTOCOL INDEPENDENT DEVICE TESTING SYSTEMS," naming Gerald Chan and Erik Volkerink as inventors. That application is incorporated herein by reference in its entirety and for all purposes.

FIELD OF THE INVENTION

The present disclosure relates generally to the field of electronic device testing systems and more specifically to the field of electronic device testing equipment for testing devices under test (DUTs).

BACKGROUND OF THE INVENTION

Automated test equipment (ATE) can be any testing assembly that performs a test on a semiconductor wafer or die, or a device such as a solid-state drive. ATE assemblies may be used to execute automated tests that quickly perform measurements and generate test results that can then be analyzed. An ATE assembly may be anything from a computer system coupled to a meter, to a complicated automated test assembly that may include a custom, dedicated computer control system and many different test instruments that are capable of automatically testing electronics parts and/or semiconductor wafer testing, such as system-on-chip (SOC) testing or integrated circuit testing. ATE systems both reduce the amount of time spent on testing devices to ensure that the device functions as designed and serve as a diagnostic tool to determine the presence of faulty components within a given device before it reaches the consumer.

Typically, ATE can be used to undertake operational life tests on the devices under test (DUTs), e.g. integrated circuit devices (ICs) to measure their reliability. An operational life test achieves this by continually exercising a DUT, or a plurality of DUTs simultaneously. Operational life tests also include testing in a thermal chamber or oven having a controlled environment, with instrumentation controlled to simulate use by a customer.

During operational life testing a plurality of DUTs can be mounted on burn-in boards or load board fixtures within the thermal chamber. While the DUTs are being electrically tested, the temperature within the chamber is cycled to simulate temperature cycling experienced by the devices during normal use. It has been found that with operational life testing infant mortality rates can be determined, which aids in avoiding early failures in the field. Additionally, reliability problems can be dealt with by component "burn-in" which includes testing the DUTs at increased temperature to induce infant mortality failures at the factory.

The concept of burn-in is a method for screening out early failures in a group of DUTs prior to their introduction into general service by a customer. The burn-in process involves time as an important factor since the elements to be tested are monitored for failure either continuously or at predefined time sequence. A goal with respect to burn-in is to provide an adequate burn-in period to detect infant mortals while not testing devices any longer than is necessary.

One of the challenges associated with burn-in is interconnecting the components of the system, e.g., controls, power supplies, etc. with the DUTs while they are in the thermal chamber. Typically, in conventional systems, it is challenging to perform high speed testing of the DUTs because the signals experience losses in signal integrity as they travel to the DUTs. This is because the methods usually used to connect the DUTs to the controls can be lossy over long distances. Accordingly, conventional thermal chambers only support low speed testing of DUTs.

Further, in conventional systems, it is challenging to stack DUTs horizontally far from the oven wall because long traces on printed circuit boards (PCBs) needed to reach all the DUTs result in issues with signal integrity within the system. As a result, the space within the thermal chamber could not typically be optimized.

Also, in conventional systems, swapping a DUT would require powering off the system to remove or insert the DUT. This can prolong oven down-time and reduce testing throughput.

BRIEF SUMMARY OF THE INVENTION

Accordingly, a need exists for a tester architecture that can address the problems with the systems described above. What is needed is a test architecture that provides an interface for high speed testing of DUTs through an oven wall and allows for horizontal stacking of DUTs within the thermal chamber for optimal space utilization. Further, what is needed is a test architecture that allows for hot swapping and hot plugging of DUTs.

In one embodiment, a tester system is disclosed. The tester system comprises a tester module operable to generate test signals for testing a plurality of DUTs. It also comprises a plurality of cables operable to communicatively couple the tester module with a tray comprising the plurality of DUTs through a thermal chamber wall interface. Further, it comprises a plurality of connectors in contact with the tray, wherein the plurality of connectors is operable to provide an interface between the plurality of cables and conductive traces on the tray, and further wherein each of the plurality of connectors is operable to pass a respective subset of the test signals to each DUT on the tray via the conductive traces.

In one embodiment, a test equipment apparatus is disclosed. The test equipment apparatus comprises a tester tray comprising sockets operable to communicatively couple the tester tray with a plurality of DUTs. It also comprises a plurality of connectors in contact with the tester tray. The plurality of connectors is operable to provide an interface between test signals received via cables and conductive pads on the tester tray. Also, each of the plurality of connectors is operable to pass a respective subset of the test signals to each DUT on the tester tray via the conductive pads. Finally, each of the connectors from the plurality of connectors comprises: (a) an interposer operable to communicatively couple the test signals with pads on the tray; (b) a connector operable to receive the test signals through the cables; and (c) a printed circuit board for interfacing the interposer with the connector.

In another embodiment, a method for testing using an automated test equipment (ATE) is disclosed. The method comprises transmitting test signals generated by a tester module for testing a plurality of DUTs through a thermal chamber wall interface using a plurality of cables. It also comprises communicating the test signals to a tray comprising the plurality of DUTs using the plurality of cables, wherein the plurality of cables communicatively couple the tester module to the tray. Finally, it comprises passing a respective subset of the test signals to each DUT on the tray via one of a plurality of connectors in contact with the tray, wherein the plurality of connectors provide an interface between the plurality of cables and conductive traces on the tray.

The following detailed description together with the accompanying drawings will provide a better understanding of the nature and advantages of the present invention.

BRIEF DESCRIPTION OF THE DRAWINGS

Embodiments of the present invention are illustrated by way of example, and not by way of limitation, in the figures of the accompanying drawings and in which like reference numerals refer to similar elements.

DETAILED DESCRIPTION OF THE INVENTION

Figure 1:
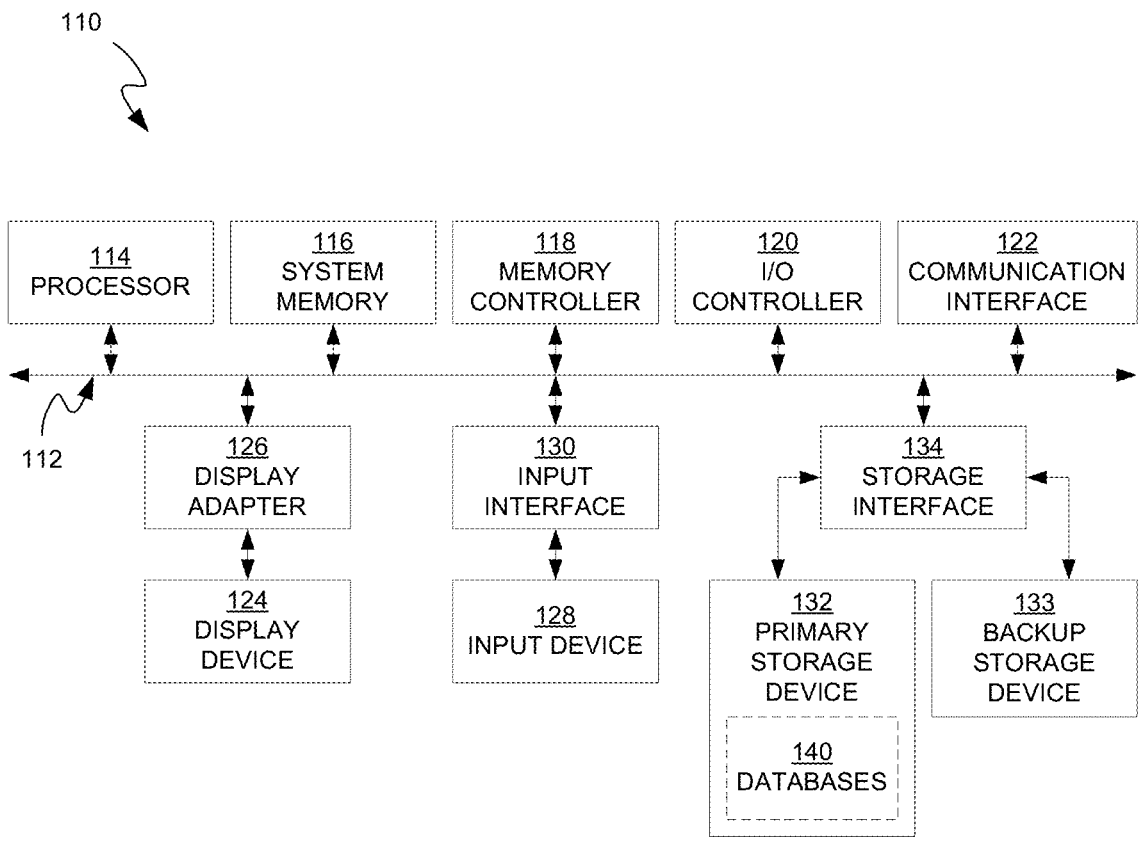
FIG. 1 is a block diagram of an example of a tester computing system capable of implementing embodiments of the present disclosure.

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Some portions of the detailed descriptions that follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those utilizing physical manipulations of physical quantities. Usually, although not necessarily, these quantities take the form of electrical or magnetic signals capable of being stored, transferred, combined, compared, and otherwise manipulated in a computer system. It has proven convenient at times, principally for reasons of common usage, to refer to these signals as transactions, bits, values, elements, symbols, characters, samples, pixels, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present disclosure, discussions utilizing terms such as "generating," "transmitting," "communicating," "passing," "allocating," "associating," "moving," "copying," "setting," "accessing," "or the like, refer to actions and processes (e.g., flowchart 1200 of FIG. 12) of a computer system or similar electronic computing device or processor (e.g., system 110 of FIG. 1). The computer system or similar electronic computing device manipulates and transforms data represented as physical (electronic) quantities within the computer system memories, registers or other such information storage, transmission or display devices.

For expository purposes, the term "horizontal" as used herein refers to a plane parallel to the plane or surface of an object, regardless of its orientation. The term "vertical" refers to a direction perpendicular to the horizontal as just defined. Terms such as "above," "below," "bottom," "top," "side," "higher," "lower," "upper," "over," and "under" are referred to with respect to the horizontal plane.

Embodiments described herein may be discussed in the general context of computer-executable instructions residing on some form of computer-readable storage medium, such as program modules, executed by one or more computers or other devices. By way of example, and not limitation, computer-readable storage media may comprise non-transitory computer-readable storage media and communication media; non-transitory computer-readable media include all computer-readable media except for a transitory, propagating signal. Generally, program modules include routines, programs, objects, components, data structures, etc., that perform particular tasks or implement particular abstract data types. The functionality of the program modules may be combined or distributed as desired in various embodiments.

Computer storage media includes volatile and nonvolatile, removable and non-removable media implemented in any method or technology for storage of information such as computer-readable instructions, data structures, program modules or other data. Computer storage media includes, but is not limited to, random access memory (RAM), read only memory (ROM), electrically erasable programmable ROM (EEPROM), flash memory or other memory technology, compact disk ROM (CD-ROM), digital versatile disks (DVDs) or other optical storage, magnetic cassettes, magnetic tape, magnetic disk storage or other magnetic storage devices, or any other medium that can be used to store the desired information and that can accessed to retrieve that information.

Communication media can embody computer-executable instructions, data structures, and program modules, and includes any information delivery media. By way of example, and not limitation, communication media includes wired media such as a wired network or direct-wired connection, and wireless media such as acoustic, radio frequency (RF), infrared, and other wireless media. Combinations of any of the above can also be included within the scope of computer-readable media.

FIG. 1 is a block diagram of an example of a tester computing system 110 capable of implementing embodiments of the present disclosure. For example, tester computing system 110, in one embodiment, can be system controller 201, discussed in detail below. Computing system 110 broadly represents any single or multi-processor computing device or system capable of executing computer-readable instructions. Examples of computing system 110 include, without limitation, workstations, laptops, client-side terminals, servers, distributed computing systems, handheld devices, or any other computing system or device. In its most basic configuration, computing system 110 may include at least one processor 114 and a system memory 116.

Processor 114 generally represents any type or form of processing unit capable of processing data or interpreting and executing instructions. In certain embodiments, processor 114 may receive instructions from a software application or module. These instructions may cause processor 114 to perform the functions of one or more of the example embodiments described and/or illustrated herein.

System memory 116 generally represents any type or form of volatile or non-volatile storage device or medium capable of storing data and/or other computer-readable instructions. Examples of system memory 116 include, without limitation, RAM, ROM, flash memory, or any other suitable memory device. Although not required, in certain embodiments computing system 110 may include both a volatile memory unit (such as, for example, system memory 116) and a non-volatile storage device (such as, for example, primary storage device 132).

Computing system 110 may also include one or more components or elements in addition to processor 114 and system memory 116. For example, in the embodiment of FIG. 1, computing system 110 includes a memory controller 118, an input/output (I/O) controller 120, and a communication interface 122, each of which may be interconnected via a communication infrastructure 112. Communication infrastructure 112 generally represents any type or form of infrastructure capable of facilitating communication between one or more components of a computing device. Examples of communication infrastructure 112 include, without limitation, a communication bus (such as an Industry Standard Architecture (ISA), Peripheral Component Interconnect (PCI), PCI Express (PCIe), or similar bus) and a network.

Memory controller 118 generally represents any type or form of device capable of handling memory or data or controlling communication between one or more components of computing system 110. For example, memory controller 118 may control communication between processor 114, system memory 116, and I/O controller 120 via communication infrastructure 112.

I/O controller 120 generally represents any type or form of module capable of coordinating and/or controlling the input and output functions of a computing device. For example, I/O controller 120 may control or facilitate transfer of data between one or more elements of computing system 110, such as processor 114, system memory 116, communication interface 122, display adapter 126, input interface 130, and storage interface 134.

Communication interface 122 broadly represents any type or form of communication device or adapter capable of facilitating communication between example computing system 110 and one or more additional devices. For example, communication interface 122 may facilitate communication between computing system 110 and a private or public network including additional computing systems. Examples of communication interface 122 include, without limitation, a wired network interface (such as a network interface card), a wireless network interface (such as a wireless network interface card), a modem, and any other suitable interface. In one embodiment, communication interface 122 provides a direct connection to a remote server via a direct link to a network, such as the Internet. Communication interface 122 may also indirectly provide such a connection through any other suitable connection.

Communication interface 122 may also represent a host adapter configured to facilitate communication between computing system 110 and one or more additional network or storage devices via an external bus or communications channel. Examples of host adapters include, without limitation, Small Computer System Interface (SCSI) host adapters, Universal Serial Bus (USB) host adapters, IEEE (Institute of Electrical and Electronics Engineers) 1394 host adapters, Serial Advanced Technology Attachment (SATA) and External SATA (eSATA) host adapters, Advanced Technology Attachment (ATA) and Parallel ATA (PATA) host adapters, Fibre Channel interface adapters, Ethernet adapters, or the like. Communication interface 122 may also allow computing system 110 to engage in distributed or remote computing. For example, communication interface 122 may receive instructions from a remote device or send instructions to a remote device for execution.

As illustrated in FIG. 1, computing system 110 may also include at least one display device 124 coupled to communication infrastructure 112 via a display adapter 126. Display device 124 generally represents any type or form of device capable of visually displaying information forwarded by display adapter 126. Similarly, display adapter 126 generally represents any type or form of device configured to forward graphics, text, and other data for display on display device 124.

As illustrated in FIG. 1, computing system 110 may also include at least one input device 128 coupled to communication infrastructure 112 via an input interface 130. Input device 128 generally represents any type or form of input device capable of providing input, either computer- or human-generated, to computing system 110. Examples of input device 128 include, without limitation, a keyboard, a pointing device, a speech recognition device, or any other input device.

As illustrated in FIG. 1, computing system 110 may also include a primary storage device 132 and a backup storage device 133 coupled to communication infrastructure 112 via a storage interface 134. Storage devices 132 and 133 generally represent any type or form of storage device or medium capable of storing data and/or other computer-readable instructions. For example, storage devices 132 and 133 may be a magnetic disk drive (e.g., a so-called hard drive), a floppy disk drive, a magnetic tape drive, an optical disk drive, a flash drive, or the like. Storage interface 134 generally represents any type or form of interface or device for transferring data between storage devices 132 and 133 and other components of computing system 110.

In one example, databases 140 may be stored in primary storage device 132. Databases 140 may represent portions of a single database or computing device or it may represent multiple databases or computing devices. For example, databases 140 may represent (be stored on) a portion of computing system 110 and/or portions of example network architecture 200 in FIG. 2 (below). Alternatively, databases 140 may represent (be stored on) one or more physically separate devices capable of being accessed by a computing device, such as computing system 110 and/or portions of network architecture 200.

Continuing with reference to FIG. 1, storage devices 132 and 133 may be configured to read from and/or write to a removable storage unit configured to store computer software, data, or other computer-readable information. Examples of suitable removable storage units include, without limitation, a floppy disk, a magnetic tape, an optical disk, a flash memory device, or the like. Storage devices 132 and 133 may also include other similar structures or devices for allowing computer software, data, or other computer-readable instructions to be loaded into computing system 110. For example, storage devices 132 and 133 may be configured to read and write software, data, or other computer-readable information. Storage devices 132 and 133 may also be a part of computing system 110 or may be separate devices accessed through other interface systems.

Many other devices or subsystems may be connected to computing system 110. Conversely, all of the components and devices illustrated in FIG. 1 need not be present to practice the embodiments described herein. The devices and subsystems referenced above may also be interconnected in different ways from that shown in FIG. 1. Computing system 110 may also employ any number of software, firmware, and/or hardware configurations. For example, the example embodiments disclosed herein may be encoded as a computer program (also referred to as computer software, software applications, computer-readable instructions, or computer control logic) on a computer-readable medium.

The computer-readable medium containing the computer program may be loaded into computing system 110. All or a portion of the computer program stored on the computer-readable medium may then be stored in system memory 116 and/or various portions of storage devices 132 and 133. When executed by processor 114, a computer program loaded into computing system 110 may cause processor 114 to perform and/or be a means for performing the functions of the example embodiments described and/or illustrated herein. Additionally or alternatively, the example embodiments described and/or illustrated herein may be implemented in firmware and/or hardware.

High Speed Tester Communication Interface Between Test Slice and Trays

Embodiments of the present invention provide a novel interface for high speed testing of DUTs through an oven wall. Embodiments of the present invention also allow for horizontal stacking of DUTs within the thermal chamber for optimum space utilization. Further, embodiments of the present invention provide a test architecture that allows for hot swapping and hot plugging of DUTs.

Figure 2:
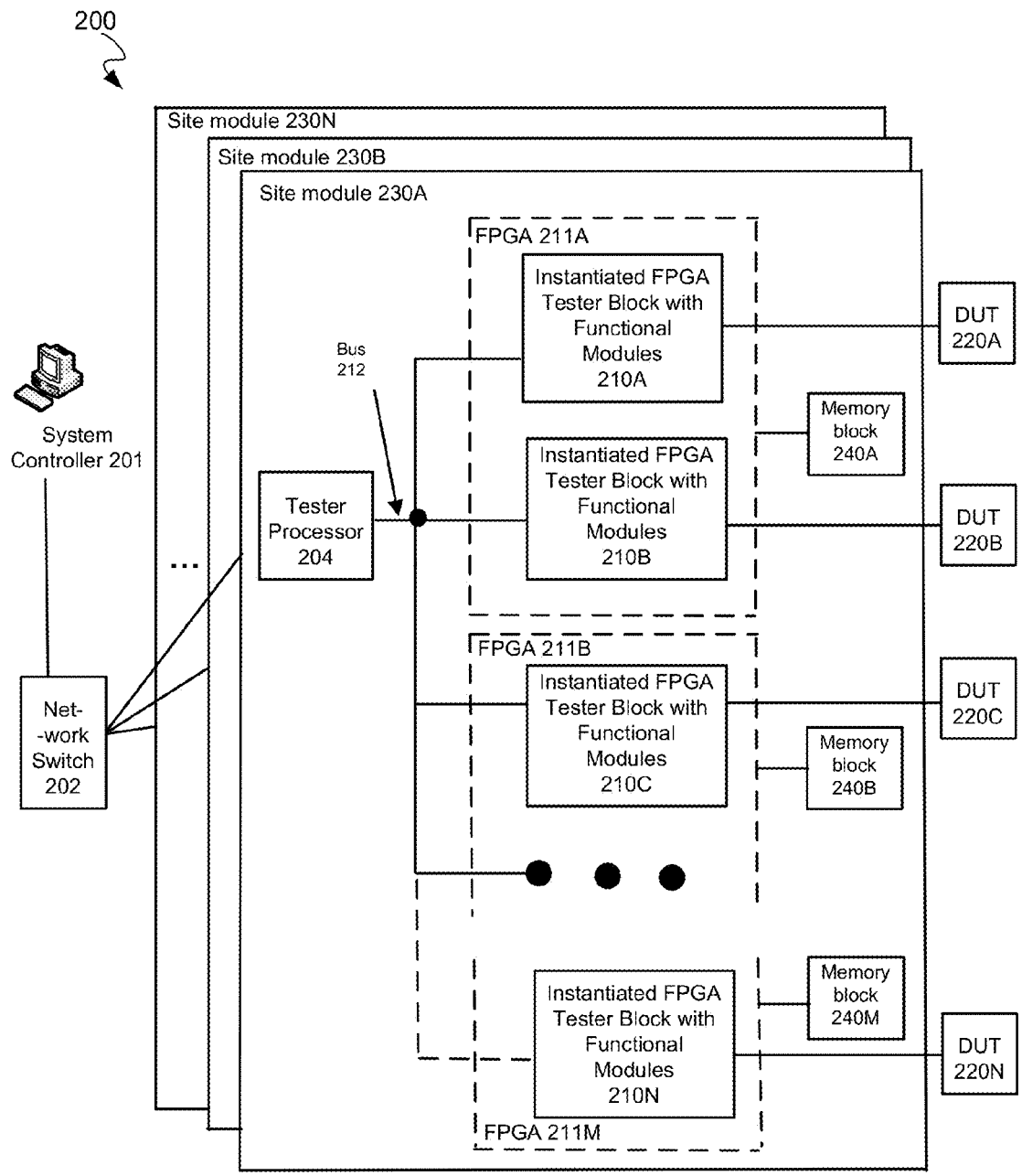
FIG. 2 is a high level exemplary block diagram of interconnections between the system controller, the site modules and the DUTs according to one embodiment of the present invention.

FIG. 2 is a high level exemplary block diagram of interconnections between the system controller, the site modules and the DUTs according to one embodiment of the present invention. The system controller 201 and site modules 230A-230N illustrated in FIG. 2 are used to generate high speed control signals for DUTs 220A-220N. It should be noted, however, that the present invention is not restricted to generating control signals using the system controller 201 and site modules 230A-230N illustrated in FIG. 2, but instead high speed signals used to control and test the DUTs can be generated in several ways using a variety of different embodiments.

Referring to FIG. 2, the ATE apparatus 200 can comprise a system controller 201, a network switch 202 connecting the system controller to the site module boards 230A-230N, FPGA devices 211A-211M comprising instantiated FPGA tester blocks 210A-210N, memory block modules 240A-240M wherein each of the memory blocks is connected to one of the FPGA devices 211A-211M, and the devices under test (DUTs) 220A-220N, wherein each device under test 220A-220N is connected to one of the instantiated FPGA tester blocks 210A-210N.

In one embodiment, the system controller 201 may be a computer system, e.g., a personal computer (PC) that provides a user interface for the user of the ATE to load the test programs and run tests for the DUTs connected to the ATE 200. In one embodiment, the system controller 201 may be similar to tester computing system 110 illustrated in FIG. 1. The Verigy Stylus™ Operating System is one example of test software normally used during device testing. It provides the user with a graphical user interface from which to configure and control the tests. It can also comprise functionality to control the test flow, control the status of the test program, determine which test program is running, and log test results and other data related to test flow. In one embodiment, the system controller can be connected to and control as many as 512 DUTs.

In one embodiment, the system controller 201 can be connected to the site module boards 230A-230N through a network switch, such as an Ethernet switch. In other embodiments, the network switch may be compatible with a different protocol such as Fibre Channel, 802.11 or ATM, for instance.

In one embodiment, each of the site module boards 230A-230N may be a separate standalone board used for purposes of evaluation and development that attaches to custom-built load board fixtures, on which the DUTs 220A-220N are loaded, and also to the system controller 201 from where the test programs are received.

The site module boards 230A-230N can each comprise at least one tester processor 204 and at least one FPGA device. The tester processor 204 and the FPGA devices 211A-211M on the site module board run the test methods for each test case in accordance with the test program instructions received from the system controller 201. In one embodiment the tester processor can be a commercially available Intel 8086 CPU or any other well-known processor. Further, the tester processor may be operating on the Ubuntu OS x64 operating system and running the Core Software, which allows it to communicate with the Stylus software running on the system controller, to run the test methods. The tester processor 204 controls the FPGA devices on the site module and the DUTs connected to the site module based on the test program received from the system controller.

The tester processor 204 is connected to and can communicate with the FPGA devices over bus 212. In one embodiment, tester processor 204 communicates with each of the FPGA devices 211A-211M over a separate dedicated bus. In one embodiment, tester processor 204 can control the testing of the DUTs 220A-220N transparently through the FPGAs with minimal processing functionality allocated to the FPGA devices. In this embodiment, the data traffic over bus 212 can be exhausted rapidly because all the commands and data generated by the tester processor need to be communicated over the bus to the FPGA devices. In other embodiments, the tester processor 204 can share the processing load by allocating functionality to control the testing of the DUTs to the FPGA devices. In these embodiments, the traffic over bus 212 is reduced because the FPGA devices can generate their own commands and data.

In one embodiment, each of the FPGA devices 211A-211M is connected to its own dedicated memory block 240A-240M. These memory blocks can, among other things, be utilized to store the test pattern data that is written out to the DUTs. In one embodiment, each of the FPGA devices can comprise two instantiated FPGA tester blocks 210A-210B with functional modules for performing functions including implementation of communicative protocol engines and hardware accelerators as described further herein. Memory blocks 240A-240 M can each contain one or more memory modules, wherein each memory module within the memory block can be dedicated to one or more of the instantiated FPGA tester blocks 210A-210B. Accordingly, each of the instantiated FPGA tester blocks 210A-210B can be connected to its own dedicated memory module within memory block 240A. In another embodiment, instantiated FPGA tester blocks 210A and 210B can share one of the memory modules within memory block 240A.

Further, each of the DUTs 220A-220N in the system can be connected to a dedicated instantiated FPGA tester block 210A-210N in a "tester per DUT" configuration, wherein each DUT gets its own tester block. This allows separate test execution for each DUT. The hardware resources in such a configuration are designed in a manner to support individual DUTs with minimal hardware sharing. This configuration also allows many DUTs to be tested in parallel, where each DUT can be connected to its own dedicated FPGA tester block and be running a different test program.

The configuration of the site modules 230A-230N depicted in FIG. 2 has several advantages. First, it eliminates the need for protocol-specific elements in the system because communication protocol modules supporting the appropriate protocol, e.g. PCIe, SATA, etc. can be programmed directly on the instantiated FPGA tester blocks within the FPGA devices. The instantiated tester blocks can be configured to communicate with the DUTs in any protocols that the DUTs support. Accordingly, if DUTs with different protocol support need to be tested, they can be connected to the same system and the FPGAs can be reprogrammed with support for the associated protocols. As a result, one ATE body can be easily configured to test DUTs supporting many different types of protocols.

In one embodiment, new protocols can be downloaded and installed directly on the FPGAs via a simple bit-stream download from a cache on system controller 201 without any kind of hardware interactions. For example, the FPGAs 211A-211M in the ATE apparatus 200 can be configured with the PCIe protocol to test PCIe devices initially and subsequently reconfigured via a software download to test SATA devices. Also, if a new protocol is released, the FPGAs can easily be configured with that protocol via a bit-stream download instead of having to physically switch all the hardware bus adapter cards in the system. Finally, if a non-standard protocol needs to be implemented, the FPGAs can nonetheless be configured to implement such a protocol. Because DUTs 220A-220N may need to communicate with site modules 230A-230N in any one of several protocols, some of which may be high speed, the interface between the site modules and the DUTs needs to be able to support exchange of very high speed signals. As discussed above, in conventional systems exchange of high speed signals between DUTs in a thermal chamber and the controls is challenging to do because high speed signals degrade easily when transmitted over long cables or through long traces on a printed circuit board ("PCB").

The architecture presented in FIG. 2 also reduces processing load on the tester processor 204 by distributing the command and test pattern generating functionality to FPGA devices, where each DUT has a dedicated FPGA module running the test program specific to it. For instance, instantiated FPGA tester block 210A is connected to DUT 220A and runs test programs specific to DUT 220A. The hardware resources in such a configuration are designed in a manner to support individual DUTs with minimal hardware sharing. This "tester per DUT" configuration also allows more DUTs to be tested per processor and more DUTs to be tested in parallel. Furthermore, with the FPGAs capable of generating their own commands and test patterns in certain modes, the bandwidth requirements on bus 212 connecting the tester processor with the other hardware components, including FPGA devices, device power supplies (DPS) and DUTs, is also reduced. As a result more DUTs can be tested simultaneously than in prior configurations.

As discussed above, that the present invention is not restricted to generating control signals using the system controller 201 and site modules 230A-230N illustrated in FIG. 2, but instead high speed signals used to control and test the DUTs can be generated in several ways using a variety of different embodiments. For example, high speed and high bandwidth signals used to control and test the DUTs can be generated from a tester processor without using any associated FPGA devices. In this embodiment, the tester processor would comprise an associated memory and be able to control the connected DUTs directly.

Figure 3:
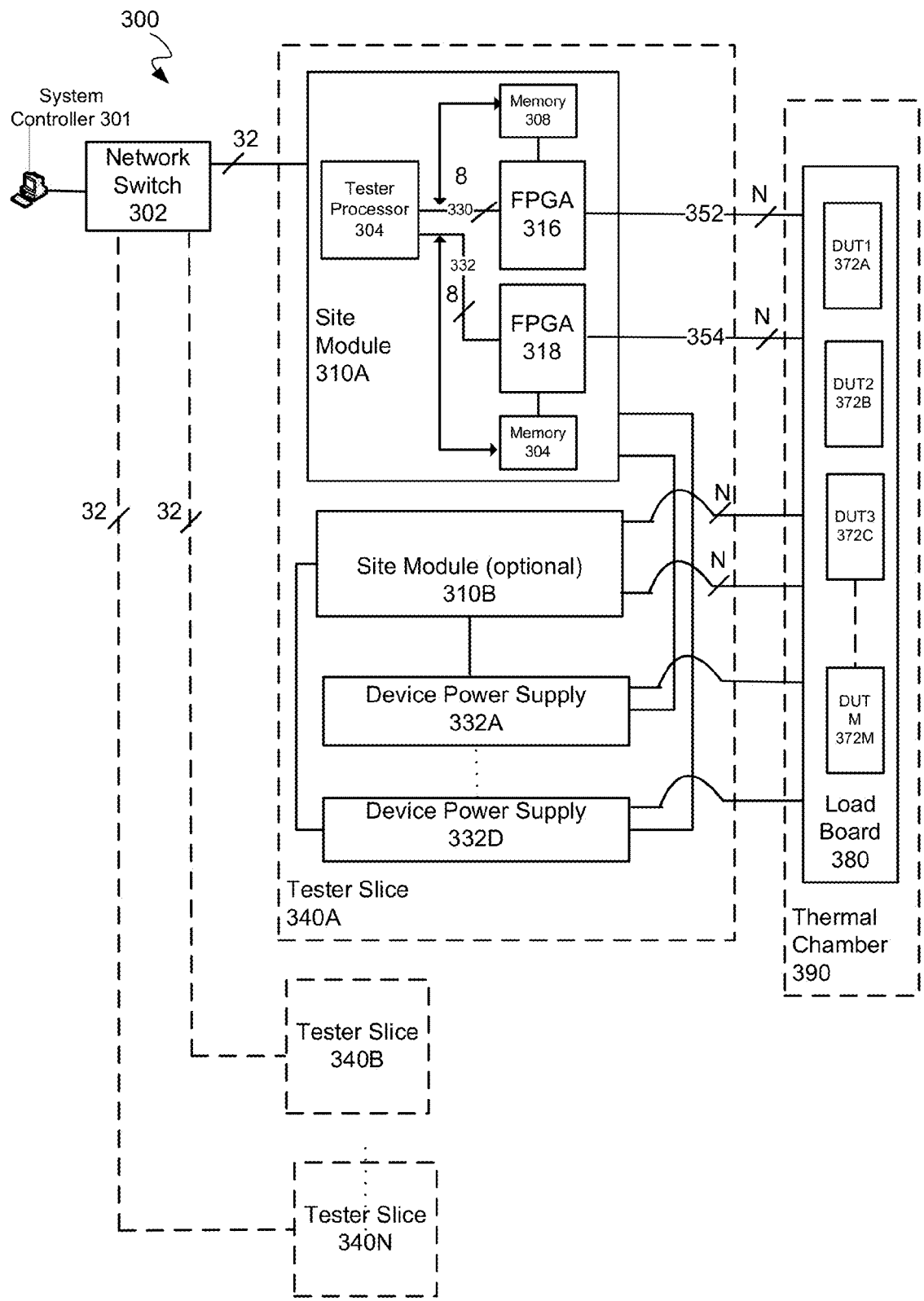
FIG. 3 is a more detailed exemplary block diagram of the site module and its interconnections with the DUTs according to an embodiment of the present invention.

FIG. 3 is a more detailed exemplary block diagram of the site module and its interconnections with the DUTs according to an embodiment of the present invention. Referring to FIG. 3, the site modules of the ATE apparatus, in one embodiment, can be mechanically configured onto tester slices 340A-340N, wherein each tester slice comprises at least one site module. In certain typical embodiments, each tester slice can comprise two site modules and two to four device power supply boards. Tester slice 340A of FIG. 3, for example, comprises site modules 310A and 310B and four device power supply boards, 332A-332D. However, there is no limit to the number of device power supply boards or site modules that can be configured onto a tester slice. Tester slice 340 is connected to system controller 301 through network switch 302. System controller 301 and network switch 302 perform the same function as elements 201 and 202 in FIG. 2 respectively. Network switch 302 can be connected to each of the site modules with a 32 bit wide bus.

Each of the device power supply boards 332A-332B can be controlled from one of the site modules 310A-310B. The software running on the tester processor 304 can be configured to assign a device power supply to a particular site module. In one embodiment, the site modules 310A-310B and the device power supplies 332A-332B are configured to communicate with each other using a high speed serial protocol, e.g., Peripheral Component Interconnect Express (PCIe), Serial AT Attachment (SATA) or Serial Attached SCSI (SAS), for instance.

In one embodiment, each site module is configured with two FPGAs as shown in FIG. 3. Each of the FPGAs 316 and 318 in the embodiment of FIG. 3. is controlled by the tester processor 304 and performs a similar function to FPGAs 211A-211M in FIG. 2. The tester processor 304 can communicate with each of the FPGAs using a 8 lane high speed serial protocol interface such as PCIe as indicated by system buses 330 and 332 in FIG. 3. In other embodiments, the tester processor 304 could also communicate with the FPGAs using different high speed serial protocols, e.g., Serial AT Attachment (SATA) or Serial Attached SCSI (SAS).

FPGAs 316 and 318 are connected to memory modules 308 and 304 respectively, where the memory modules perform a similar function to memory blocks 240A-240N in FIG. 2. The memory modules are coupled with and can be controlled by both the FPGA devices and the tester processor 304.

FPGAs 316 and 318 can be connected to the DUTs 372A-372M on the load board 380 through buses 352 and 354 respectively. The load board 380 is a physical harness that allows a general purpose high speed connection at the site module end that is agnostic to the protocol used to communicate to the DUTs on lines 352 and 354. At the DUT end, however, the load board needs to be designed so as to have connectors specific to the protocol being used by the DUT, or to a specific DUT adapter.

The DUTs 372A-372M, in one embodiment of the invention, are loaded on a load board 380 that is placed inside a thermal chamber 390 for testing. The DUTs 372A-372M and the load board 380 derive power from the device power supplies 332A-332D.

The number of DUTs that can be connected to each FPGA is contingent on the number of transceivers in the FPGA and the number of I/O lanes required by each DUT. In one embodiment, FPGAs 316 and 318 can each comprise 32 high speed transceivers and buses 352 and 354 can each be 32 bits wide, however, more or less can be implemented depending on the application. If each DUT requires 8 I/O lanes, for example, only 4 DUTs can be connected to each FPGA in such a system.

Figure 4:
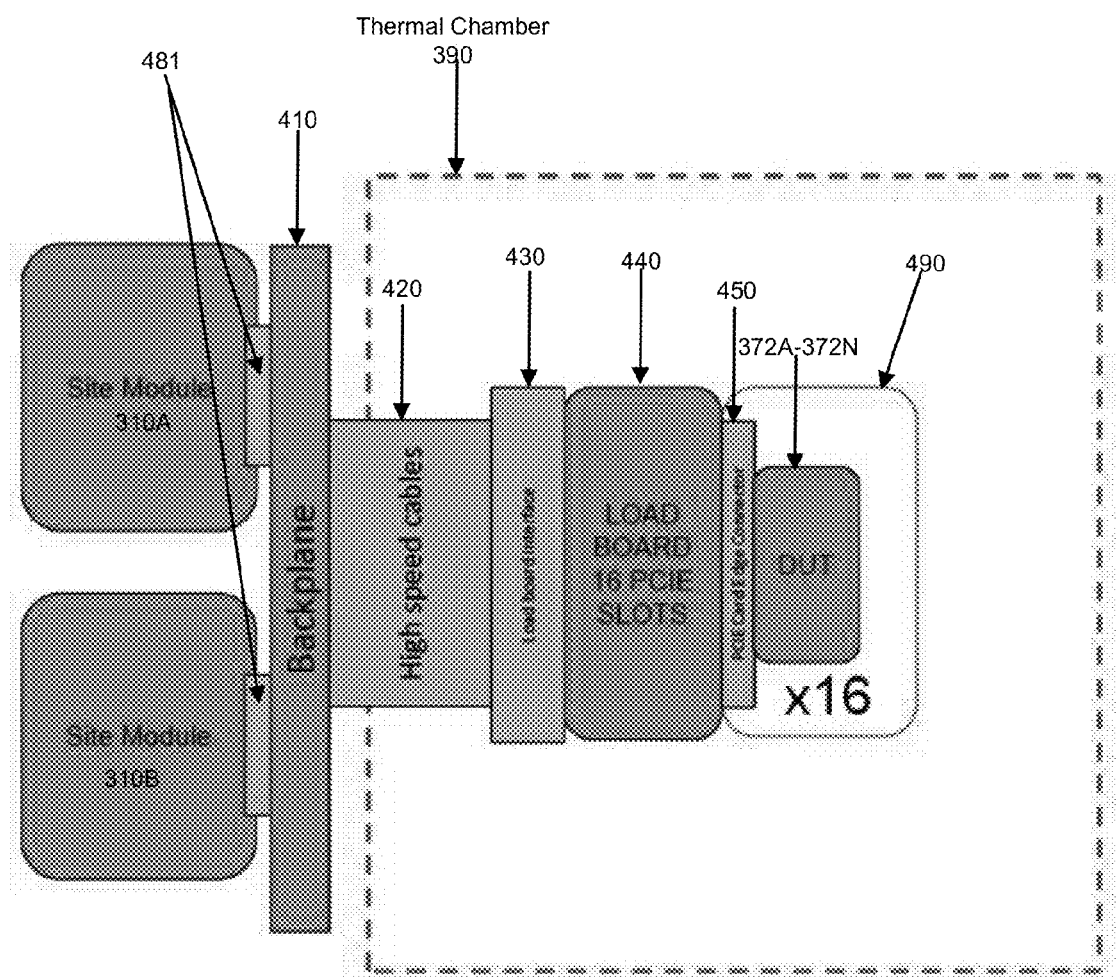
FIG. 4 is a block diagram illustrating the configuration of the DUTs within the thermal chamber according to one embodiment of the present invention.

FIG. 4 is a block diagram illustrating the configuration of the DUTs within the thermal chamber according to one embodiment of the present invention. It also illustrates the interface between the site modules, 310A and 310B, and the DUTs within thermal chamber 390. The site modules, 310A and 310B, in the embodiment illustrated in FIG. 4 are configured to communicate with DUTs 372A-372N using the PCIe protocol.

The site modules, 310A and 310B, connect to backplane 410 through general purpose connectors 481. Because the protocol engine module 430 can be configured to run any number of various communicative protocols, a general purpose high speed connector 481 is required on the site module to connect to the backplane. As a result, if the protocol implemented on the FPGAs, 316 and 318, needs to be changed, no accompanying physical modification needs to be made on the site module.

High speed cables 420 pass through the thermal chamber wall 390 to relay the high speed signals from the backplane 410 over to the load board interface 430. The load board 440 receives the signals through load board interface 430. In the embodiment illustrated in FIG. 4, the load board fixture is designed to support DUTs communicating using the PCIe protocol. If the site modules were, for example, reprogrammed to test DUTs using the SATA protocol, the load board 440 would need to be switched out and replaced with one that supports DUTs communicating using SATA.

Load board 440 illustrated in FIG. 4 has 16 PCIe slots, wherein each slot can hold a DUT supporting PCIe. Each of the DUTs (up to 16) 372A-372N connects into one of the slots of load board 440 and interfaces with the load board 440 through PCIe card edge connectors 450. In one embodiment, load board 440 can be a printed circuit board (PCB) into which the DUTs 372A-372N plug in.

Figure 5:
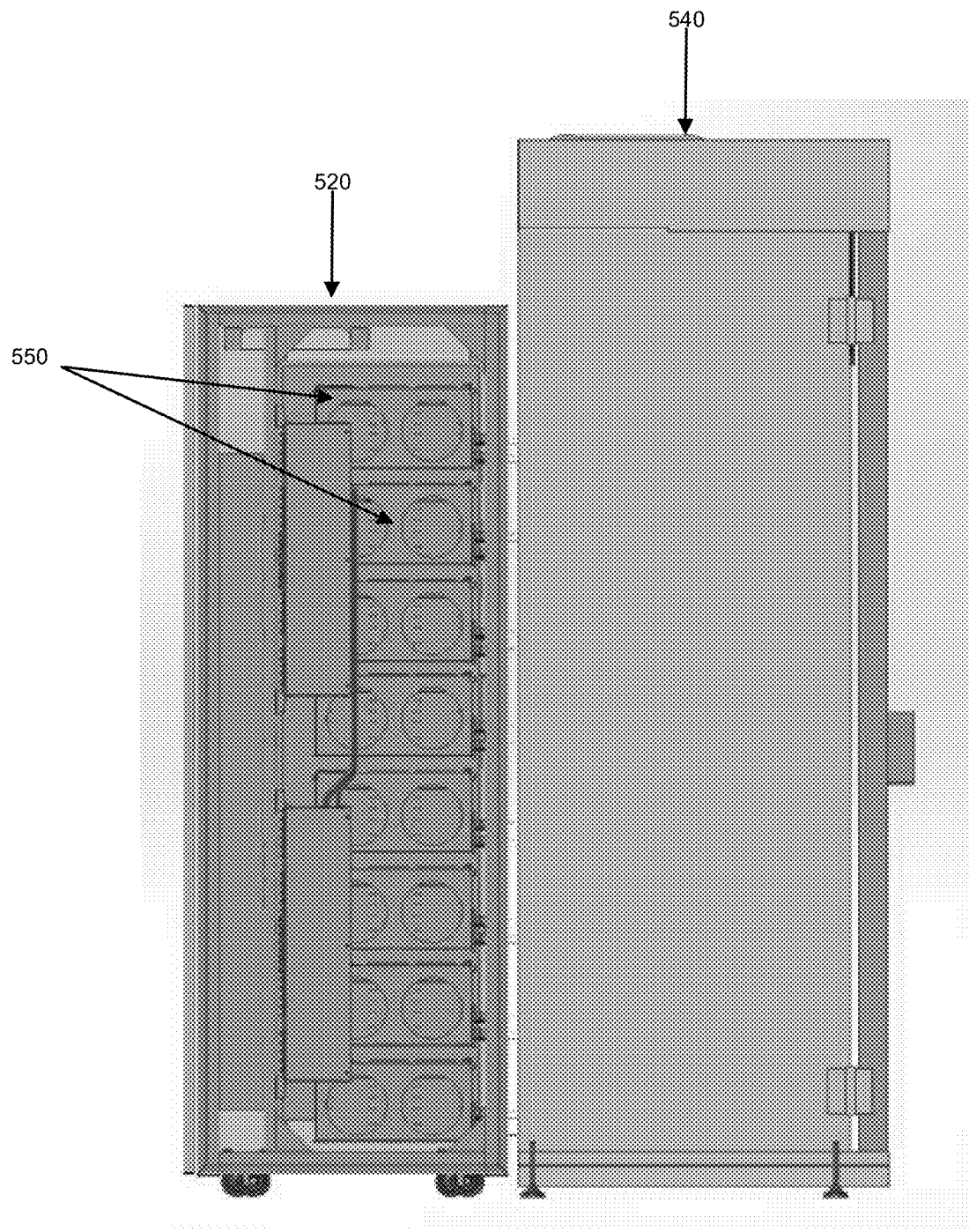
FIG. 5 is a side view illustrating the placement of the test head and the thermal chamber according to one embodiment of the present invention.

FIG. 5 is a side view illustrating the placement of the test head and the thermal chamber according to one embodiment of the present invention. Test head 520 is typically placed adjacent to the thermal chamber 540. Test head 520 comprises compartments, 550, into which the tester slices can be placed. As discussed in reference to FIG. 3, a tester slice typically comprises 2 site modules, 310A-310B, and anywhere between two to four device power supplies (DPS) 332-332D. Each compartment 550 can typically fit one tester slice. The tester slices connect to the trays carrying the DUTs through the oven wall. The trays are housed in the oven 540, wherein the burn-in procedure for the DUTs is undertaken.

Figure 6:
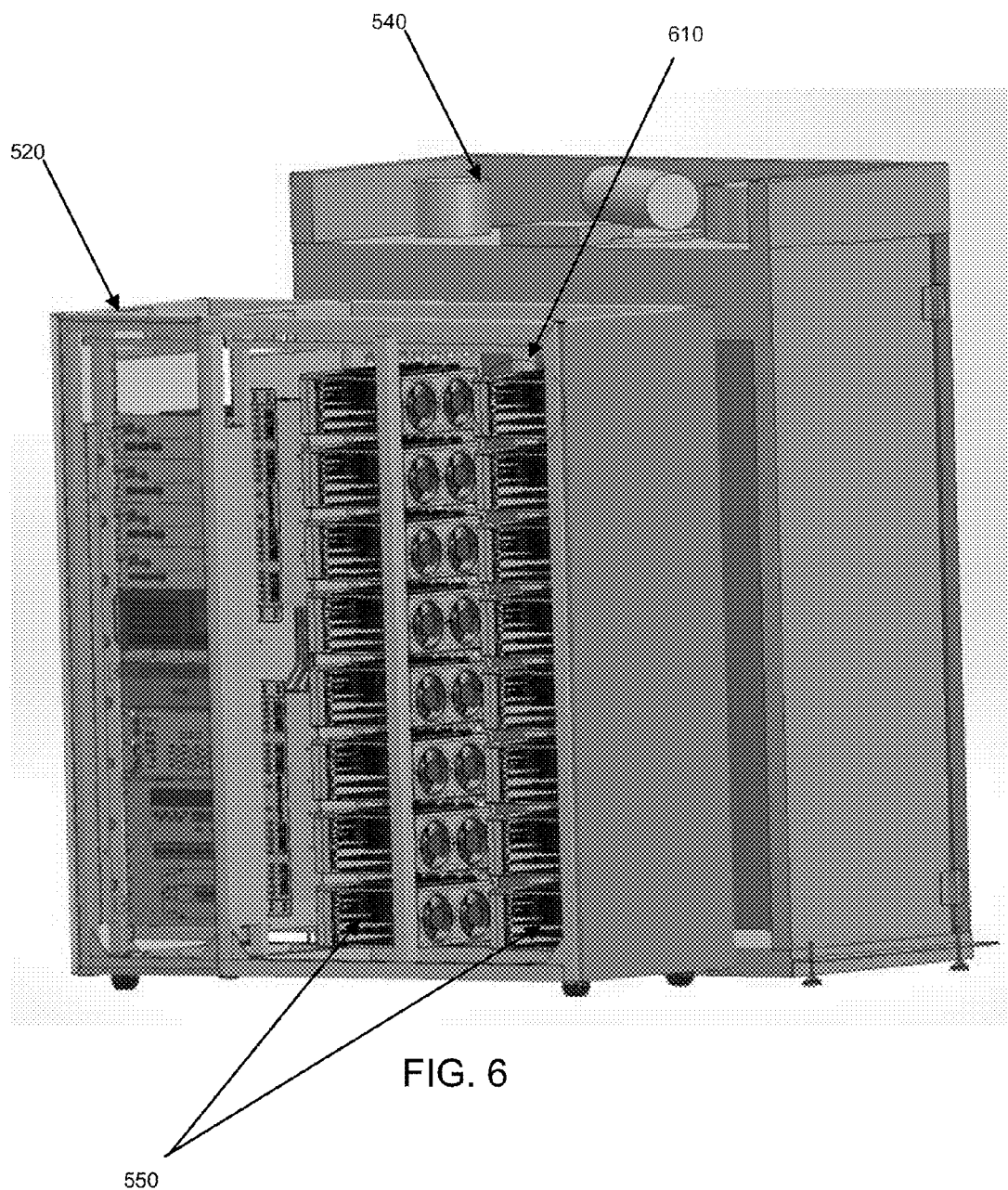
FIG. 6 is a rear view illustrating the placement of the test head and the thermal chamber according to one embodiment of the present invention.

FIG. 6 is a rear view illustrating the placement of the test head and the thermal chamber according to one embodiment of the present invention. As illustrated in FIG. 6, test head 520 is placed adjacent to thermal chamber 540. Each of the compartments 550 can typically fit one tester slice. A typical test head 520 can hold up to 16 tester slices. Each tester slice connects to a tray comprising DUTs on the opposite side of the oven wall. The oven can test the DUTs at temperatures up to 85° C. and, in one embodiment, even up to and above 100° C. Element 610 highlights one of the compartments 550 in test head 520 that is illustrated in further detail in FIG. 7 below.

Figure 7:
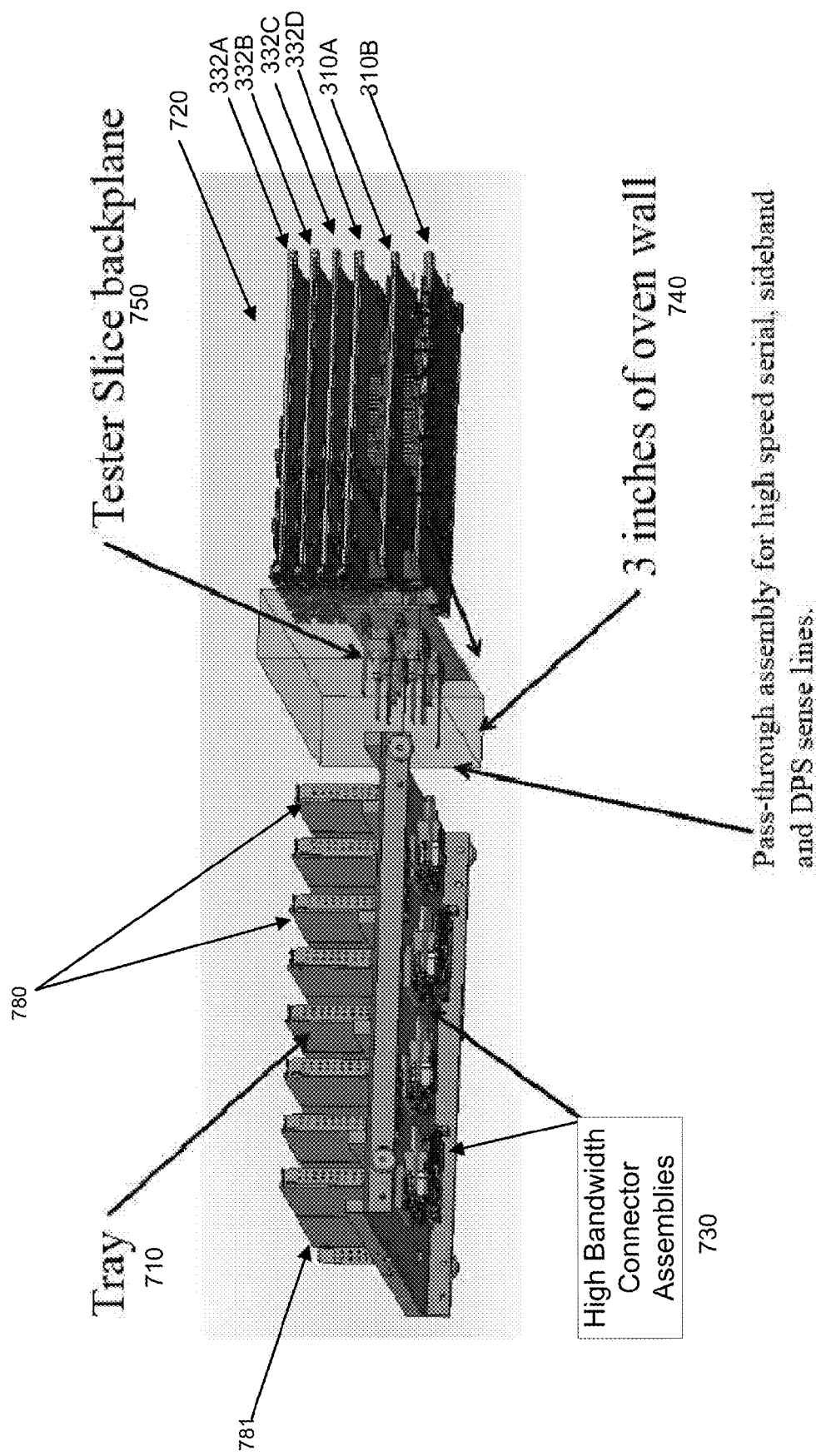
FIG. 7 illustrates an exemplary tray comprising DUTs connected to a tester slice through the thermal chamber wall according to one embodiment of the present invention.

FIG. 7 illustrates an exemplary tray comprising DUTs connected to a tester slice through the thermal chamber wall according to one embodiment of the present invention. FIG. 7 provides a detailed view showing an exemplary tester slice 720, which can typically fit into one of the compartments 550 highlighted by element 610, connecting to a tray 710 through the oven wall 740. As discussed in connection with FIG. 4, tester slice 720 can, in one embodiment, plug into a slot on the tester slice backplane 750. Tester slice backplane 750 has the same function essentially as backplane 410 illustrated in FIG. 4. As illustrated in FIG. 3, each tester slice can comprise one or more site modules, e.g., site module 310A, and one or more device power supplies, e.g., DPS 332A. In the illustration of FIG. 3, tester slice 720 comprises two site modules, 310A and 310B, and four device power supplies, 332A, 332B, 332C, and 332D.

DUTs 780 being tested within thermal chamber 540 plug into DUT connectors on a tray 710 in a typical embodiment. Typically, each tray is designed to hold up to 16 DUTs. However, the number of DUTs each tray 710 can hold is configurable.

The tray comprises the load board and a stiffener. The load board, in a typical embodiment, is a PCB into which the DUTs plug in. PCB stiffeners (not shown), typically, are mechanical devices used to rigidize a PCB and to eliminate and/or minimize the bow and twist introduced to the board during various board manufacturing processes. PCBs are typically very thin and may be made of layers of glass fabrics or fibers that are bonded together by resins. The thinness of a PCB provides an advantage in that the PCB does not consume much space. But, one drawback is that, due to its thinness, the PCB is rather flimsy and not structurally stable. The thinness of the PCB can make the board and its connected circuit components vulnerable to shock and vibration. Such shock and vibration can lead to damage or breakage of the board's copper solder traces in service or during the mating of the PCB assembly ("PCBA") with other PCBAs, other parts of the final assembly, e.g., connectors on the oven wall 740, or during the end-use of the product. Furthermore, conventional wave and reflow soldering used during the PCBA manufacturing process provides a source of heat that can soften or warp the PCB, which can cause the soldering to be uneven. Accordingly, the tray needs a PCB stiffener to strengthen the PCB. This allows the load board PCB to be stable and resistant to the pressure of the spring force used for the high bandwidth connectors and DC pogo pins, as well as the added weight of the multiple DUTs.

The oven wall 740 provides a novel interface to pass through the high-speed serial and sideband signals used to communicate with the DUTs. It also provides the interface to pass DPS force and sense lines used to supply power to the DUTs. The novel interface is advantageous because it allows both the tester slice and the tray to fit directly into compartments on either side of the thermal chamber wall 740, thereby, minimizing the length of cables used to carry control, clock and other signals from the tester slice to the DUTs 780. Further, by allowing tester slices to plug directly into the backplane adjacent to the thermal chamber wall, it allows the tester to be serviced from outside the thermal chamber.

The high bandwidth connector assemblies 730, in one embodiment, comprise digital or other types of connectors at the bottom of tray 710 that allow the high speed serial, sideband and DPS sense and force lines from the tester slice 720 to be carried directly from the tester slice backplane 750 to the DUTs through high performance cables. In one embodiment, the high bandwidth connector assemblies 730 are held in contact with the tray 710 via a spring mechanism below the high bandwidth connector assemblies 730 (not shown). The springs in the spring mechanism are used to push up on tray 710 as the tray 710 is lowered to allow that the high bandwidth connector assemblies 730 to make contact with the tray 710.

The high bandwidth connector interposer allows signals passed through the thermal chamber wall to be delivered to the DUTs being tested through the bottom of tray 710. The advantage of the novel high bandwidth connector assembly design is that it allows signals, including high speed serial signals, to be delivered directly to the DUTs using high performance bundled or ribbonized shielded differential cables instead of conductive traces etched into the board.

Conventional traces on PCB boards are lossier and incapable of delivering high speed signals for longer distances. For example, if PCB traces were being used to communicate signals in the system illustrated in FIG. 7, a high speed signal in the frequency range over 1 Gigabit/second would lose signal integrity by the time it traveled to DUT 781 from the oven wall 740. Further, special materials required to construct PCBs that would minimize such losses are very expensive and impractical to use in most instances. Consequently, in conventional testers, the DUTs had to be plugged into slots directly into the oven wall and could not be stacked horizontally on a single tray as illustrated in FIG. 7. As a result, the configuration of DUTs within the oven was shallow, resulting in a non-optimal utilization of space within the thermal chamber. Further, conventional tester systems that allowed any kind of horizontal stacking had to be run at low speed and were unable to perform testing in the high frequency ranges allowed by the present invention.

By comparison, the high bandwidth connector interface of the present system can advantageously deliver localized signals to the DUTs in the range of over 12 Gigabits/second reliably to all the DUTs on tray 710 without any loss of signal, even where some of the DUTs, e.g. DUT 781, may be over two feet away from the oven wall.

Another advantage of the present invention is that the tray 710 can readily be disconnected from the system by disengaging the tray from the high bandwidth connector assemblies 730. As discussing above, in one embodiment, the high bandwidth connector assemblies make contact with tray 710 using a spring mechanism, and the tray 710 can easily be disengaged from the spring mechanism. This allows for the hot swapping and hot plugging of DUTs without needing to power off the entire system. The other trays of DUTs connected to different slots in the oven wall can continue to be tested while one of the trays is disconnected, for example. The other advantage of connecting the tray 710 to the tester slice backplane 750 through the high bandwidth connectors is that the tray 710 is readily removable. Neither the tray 710 nor the DUTs 780 need to be pulled out of a socket, which can degrade over time as a result of repeated plugging and unplugging. In conventional tester system, the DUTs would be plugged into a connector or socket on the oven wall itself, which not only precluded stacking of the DUTs but also resulted in degradation of the sockets over time. As will be illustrated in connection with FIG. 9, the high bandwidth connector assembly comprises an interposer or pad on which the load board can be placed so that pads of the load board can come into contact with the pins on the interposer.

The configuration of the tray 710 and the high bandwidth connector assemblies 730 allows the software application running on system controller 201 for controlling the test environment to support hot insertion of trays into a running tester system without causing any disruption or requiring the system to reboot. The software application then recognizes a tray that is inserted into the system during operation without needing to power off or perform a reboot.

Figure 8:
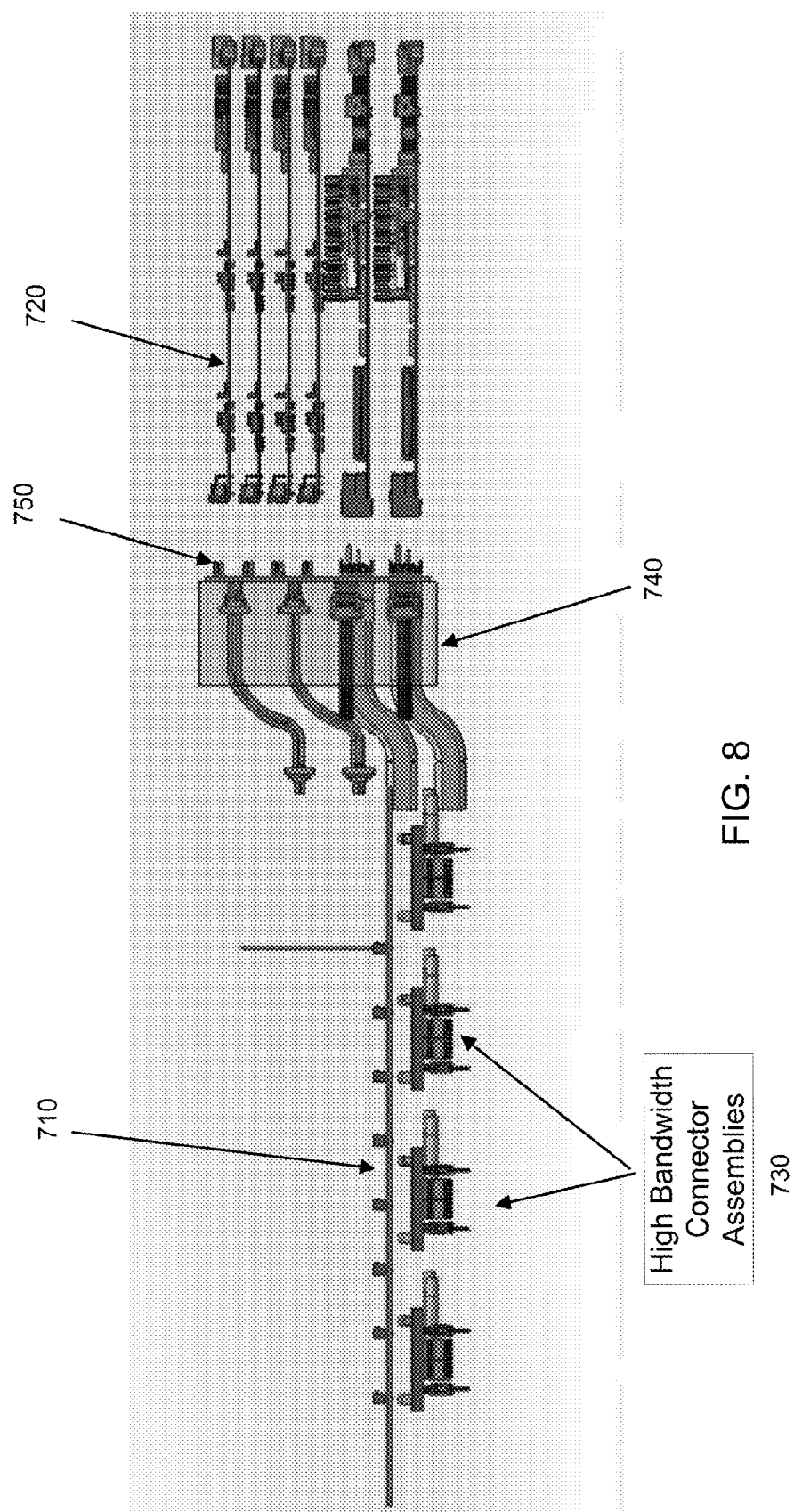
FIG. 8 is a side view illustrating the connection between the tray comprising DUTs and the DPS and site modules of the tester slice according to one embodiment of the present invention.

FIG. 8 is a side view illustrating the connection between the tray comprising DUTs and the tester slice comprising the DPS and site modules according to one embodiment of the present invention. The tester slice 720 plugs into a backplane 720 on the thermal chamber wall 740. High performance shielded differential cables carry signals from the backplane to high bandwidth connectors 730 placed below tray 710. The signals, which comprise high speed clock and data signals, are delivered to the DUTs on tray 710 through the interposer.

Figure 9:
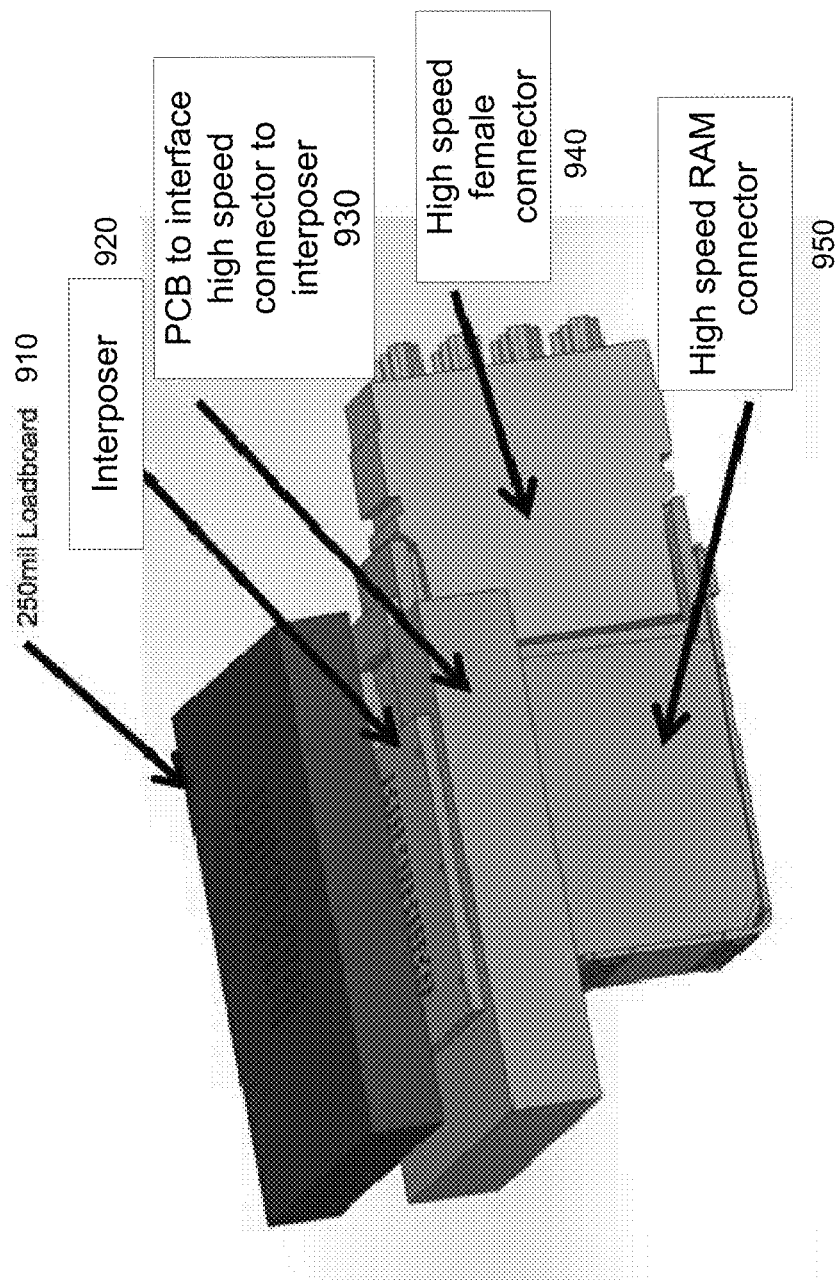
FIG. 9 illustrates the components of the high-bandwidth connector assembly in accordance with one embodiment of the present invention.

FIG. 9 illustrates the components of the high-bandwidth connector assembly in accordance with one embodiment of the present invention. The interposer 920 is part of the high bandwidth connector assembly and, in one embodiment of the present invention, makes contact with the load board 910. The interposer 920 can communicate signals to the DUTs on the load board 910 by making contact with the pads on the underside of the load board 910. The interposer 920, in the embodiment illustrated in FIG. 9, receives the signals from the tester slice through a high bandwidth digital connector. In different embodiments other types of connectors may be employed. The interposer can interface to the high bandwidth digital connector through a PCB interface 930. The high bandwidth digital connector can comprise a high speed RAM connector 950 and a high speed female cable connector 940. Female cable connector 940 receives the signals from the shielded differential twinaxial cables used to deliver signals from the tester slices to the tray. It should be noted, however, that this is only one exemplary embodiment for the high bandwidth connector assembly. The signals from the tester slices can be delivered to the bottom of load board 920 using any one of a number of different types of interfaces that are equipped to handle passage and delivery of high speed signals.

Figure 10:
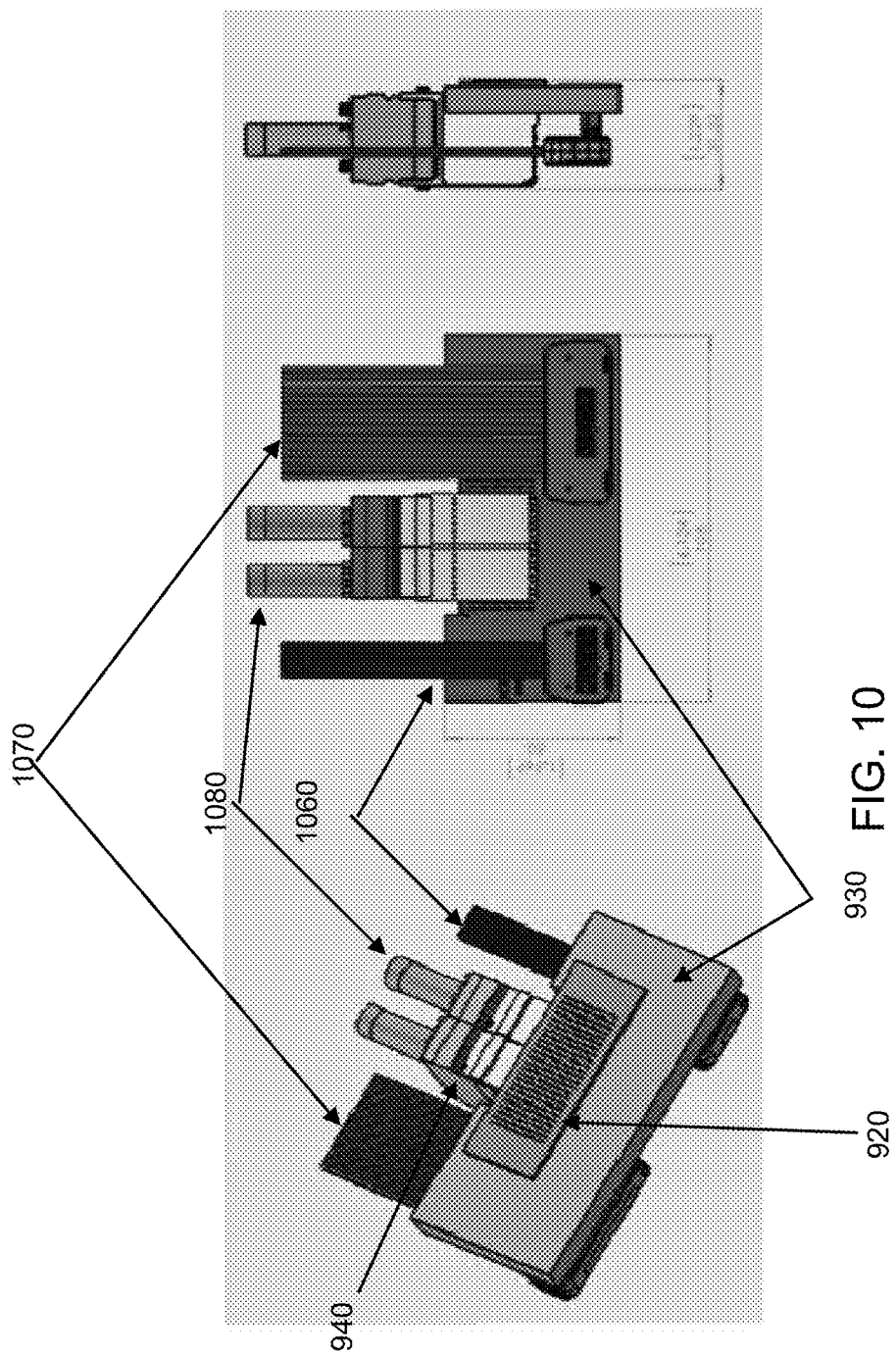
FIG. 10 illustrates the components of the high-bandwidth connector in accordance with one embodiment of the present invention.

FIG. 10 illustrates the components of the high-bandwidth connector in accordance with one embodiment of the present invention. Interposer 920 interfaces with connector 940 through PCB 930, as discussed in relation with FIG. 9. In one embodiment, the high bandwidth connector assembly can receive 64 pairs of high speed serial signals and 64 single-ended I/Os through connector 1070. It can also receive 8 pairs of reference clock signals through connector 1080. Finally, in one embodiment, it can also receive a 3-wire serial bus from the tester slice through connector 1060. It should be noted that in different embodiments, the high bandwidth connector assembly can receive a different configuration of signal from the tester slice in order to test the respective DUTs.

Figure 11:
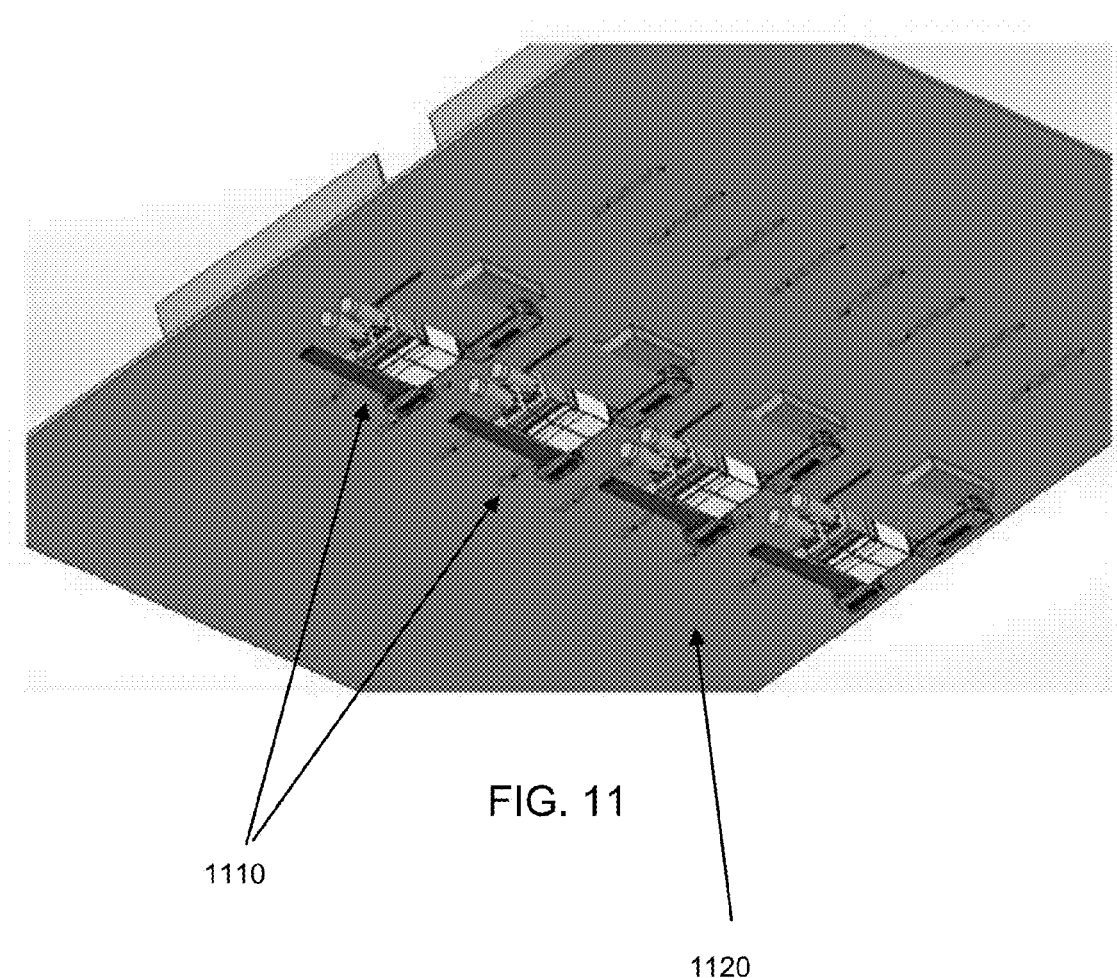
FIG. 11 illustrates high-bandwidth connector assemblies in contact with the tray in accordance with one embodiment of the present invention.

FIG. 11 illustrates high-bandwidth connector assemblies in contact with the tray in accordance with one embodiment of the present invention. In one embodiment, there can be 4 connector assemblies 1110 under each load board 11120 as shown in FIG. 11. In one embodiment, the assemblies can be configured to carry signals to the DUTs on the load board 1120 that are closest to a respective connector assembly. As discussed above, positioning the connector assemblies below the load board 1120 allows the signals from the tester slices to be delivered as close to the DUTs as feasible without needing to resort to using long traces on the load board PCB itself. Further, a user can easily regulate load board contact with the interposer by raising and lowering the high speed connector assembly using spring mechanisms. Accordingly, there is no requirement for connectors or sockets that may wear down over time. This also allows DUTs to be hot swapped by simply disengaging the load board from the high speed connector assemblies.

Figure 12:
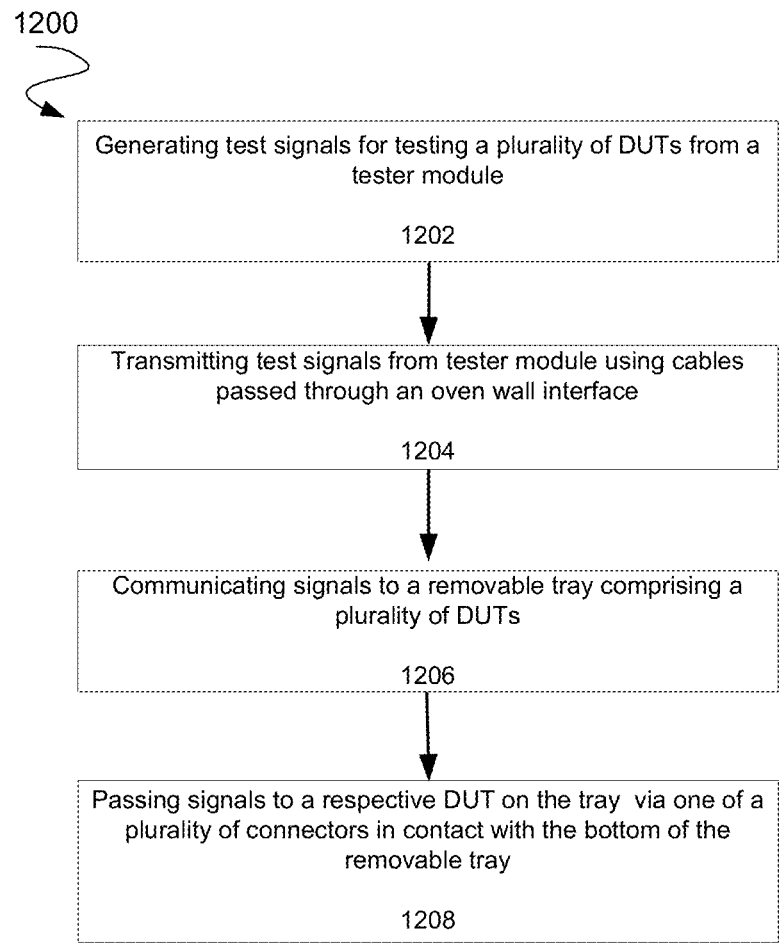
FIG. 12 depicts a flowchart of an exemplary computer controlled process of testing DUTs by using an oven interface that can support multiple connectors according to an embodiment of the present invention.

FIG. 12 depicts a flowchart of an exemplary computer controlled process of testing DUTs by using an oven interface that can support multiple connectors according to an embodiment of the present invention. The invention, however, is not limited to the description provided by flowchart 1200. Rather, it will be apparent to persons skilled in the relevant art(s) from the teachings provided herein that other functional flows are within the scope and spirit of the present invention.

Flowchart 1200 will be described with continued reference to exemplary embodiments described above in reference to FIGS. 2-11 though the method is not limited to those embodiments.

At step 1202, test signals comprising control, data and clock signals for testing a plurality of DUTs can be generated using a tester module, e.g. tester slice 720.

At step 1204, the test signals are transmitted from the tester module through the oven wall interface 740 using high bandwidth cables.

At step 1206, the signals are communicated to a removable tray 710 comprising a plurality of DUTs 780. The signals are passed to each of the respective DUTs on tray 710 via one of a plurality of connector assemblies 730 connected to the removable tray 710. In one embodiment, the connectors 730 can be affixed to the bottom of the removable tray 710.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered as examples because many other architectures can be implemented to achieve the same functionality.

The process parameters and sequence of steps described and/or illustrated herein are given by way of example only. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

Embodiments according to the invention are thus described. While the present disclosure has been described in particular embodiments, it should be appreciated that the invention should not be construed as limited by such embodiments, but rather construed according to the below claims.

What is claimed is:

1. A method for testing using an automated test equipment (ATE), said method comprising:
   transmitting test signals generated by a tester module for testing a plurality of DUTs through a thermal chamber wall interface using a plurality of cables;

communicating said test signals to a tray comprising said plurality of DUTs using said plurality of cables, wherein said plurality of cables communicatively couple said tester module to said tray; and passing a respective subset of said test signals to each DUT on said tray via one of a plurality of connectors in contact with said tray, wherein said plurality of connectors provide an interface between said plurality of cables and conductive traces on said tray, and wherein said plurality of connectors make contact with a bottom of said tray using a spring mechanism, wherein said spring mechanism is operable to push up on said tray to allow said plurality of connectors to make contact with said tray.

2. The method of claim 1, wherein said tester module comprises FPGA components operable to generate a subset of said test signals.

3. The method of claim 1, wherein said plurality of cables comprise twinaxial cables operable to transmit high speed signals.

4. The method of claim 1, wherein said tray comprises a printed circuit board and a stiffener, wherein said printed circuit board comprises sockets for plugging in a plurality of DUTs.

5. The method of claim 1, wherein each of said plurality of connectors comprises:
an interposer operable to communicatively couple said test signals with pads on said tray;
a connector operable to receive said test signals through said plurality of cables; and
a printed circuit board for interfacing said interposer with said connector.

6. The method of claim 1, wherein a DUT on said tray receives test signals from a respective connector in closest proximity to said DUT.

7. The method of claim 1, wherein said plurality of DUTs are stacked horizontally on said tray with respect to said thermal chamber wall.

8. The method of claim 1, wherein said test signals are selected from a group consisting of: serial signals, input/output (I/O) signals, and reference clocks.

9. The method of claim 8, wherein said serial signals comprise high speed serial signals.

10. A tester system comprising:
a tester module operable to generate test signals for testing a plurality of DUTs;
a plurality of cables operable to communicatively couple said tester module with a tray comprising said plurality of DUTs through a thermal chamber wall interface; and
a plurality of connectors in contact with said tray, wherein said plurality of connectors is operable to provide an interface between said plurality of cables and conductive traces on said tray, and further wherein each of said plurality of connectors is operable to pass a respective subset of said test signals to each DUT on said tray via said conductive traces and wherein said plurality of connectors make contact with a bottom of said tray using a spring mechanism, wherein said spring mechanism is operable to push up on said tray to allow said plurality of connectors to make contact with said tray.

11. The system of claim 10, wherein said tray is operable to be disconnected from said tester module by uncoupling connective pads on said tray from interposers associated with said plurality of connectors.

12. The system of claim 10, wherein said tester module comprises FPGA components operable to generate a subset of said test signals.

13. The system of claim 10, wherein said plurality of cables comprise twinaxial cables operable to transmit high speed signals.

14. The system of claim 10, wherein said tray comprises a printed circuit board and a stiffener, wherein said printed circuit board comprises sockets for plugging in a plurality of DUTs.

15. The system of claim 10, wherein each of said plurality of connectors comprises:
an interposer operable to communicatively couple said test signals with pads on said tray;
a connector operable to receive said test signals through said plurality of cables; and
a printed circuit board for interfacing said interposer with said connector.

16. The system of claim 10, wherein a DUT on said tray receives test signals from a respective connector in closest proximity to said DUT.

17. The system of claim 10, wherein said plurality of DUTs are stacked horizontally on said tray with respect to said thermal chamber wall.

18. The system of claim 10, wherein said test signals are selected from a group consisting of: serial signals, input/output (I/O) signals, and reference clocks.

19. The system of claim 18, wherein said serial signals comprise high speed serial signals.

20. A test equipment apparatus comprising:
a tester tray comprising sockets operable to communicatively couple said tester tray with a plurality of DUTs; and
a plurality of connectors in contact with said tester tray, wherein said plurality of connectors is operable to provide an interface between test signals received via cables and conductive pads on said tester tray, and wherein each of said plurality of connectors is operable to pass a respective subset of said test signals to each DUT on said tester tray via said conductive pads and wherein said plurality of connectors make contact with a bottom of said tray using a spring mechanism, wherein said spring mechanism is operable to push up on said tray to allow said plurality of connectors to make contact with said tray, and
further wherein each connector from said plurality of connectors comprises:
an interposer operable to communicatively couple said test signals with pads on said tray;
a connector operable to receive said test signals through said cables; and
a printed circuit board for interfacing said interposer with said connector.

* * * * *